US006064074A

United States Patent [19]

Van Zutphen et al.

[11] Patent Number: 6,064,074

[45] Date of Patent: May 16, 2000

[54] SEMICONDUCTOR CATHODE AND ELECTRON TUBE COMPRISING A SEMICONDUCTOR CATHODE

[75] Inventors: Tom Van Zutphen; Frederik C. Gehring; Mark A. De Samber; Erwin A. Hijzen; Ron Kroon, all of Eindhoven, Netherlands

[73] Assignee: U.S. Philips Corporation, New York, N.Y.

[21] Appl. No.: 09/046,035

[22] Filed: Mar. 23, 1998

[30] Foreign Application Priority Data

Apr. 22, 1997 [EP] European Pat. Off. .............. 97201183

[51] Int. Cl.$^{7}$ .................................................... H01L 29/06

[52] U.S. Cl. ............................... 257/10; 257/11; 257/213; 257/488; 257/491; 257/447

[58] Field of Search ................................ 257/10, 11, 213, 257/488, 491, 447

[56] References Cited

U.S. PATENT DOCUMENTS 5,604,355 2/1997 Van Zutphen ............................ 257/10

*Primary Examiner*—Fetsum Abraham
*Attorney, Agent, or Firm*—Robert J. Kraus

[57] ABSTRACT

Semiconductor device with a semiconductor cathode having an emissive part (pn junction) separated from a contact part which has locations at which a controlled breakdown occurs on a contact part metallization at excessive voltages, so that, during manufacture and operation, the emissive part in an election tube is protected from damage.

9 Claims, 7 Drawing Sheets

SEMICONDUCTOR CATHODE AND ELECTRON TUBE COMPRISING A SEMICONDUCTOR CATHODE

BACKGROUND OF THE INVENTION

The invention relates to a semiconductor device for emitting electrons, comprising a semiconductor body with at least one pn junction between an n-type region adjacent to a main surface and a p-type region, in which electrons emitted from the semiconductor body are generated by applying a voltage in the reverse direction across the pn junction, a first part of the pn junction, at the location of an emissive part of the pn junction, extending substantially parallel to the main surface and locally having a lower breakdown voltage than a second part of the pn junction, the first part being separated from the main surface by a thin n-type layer having such a thickness and doping that the depletion zone does not extend as far as the main surface at the breakdown voltage but remains separated from said main surface by a surface layer which is sufficiently thin to pass generated electrons.

A semiconductor device of this type is used in an electron tube which may be used as a display tube or a camera tube, but may be alternatively adapted, for example, for electrolithographic applications or electron microscopy.

The invention also relates to an electron tube comprising such a semiconductor device.

In this description, pn junction is not only understood to mean a pure pn junction but any junction structure between a p-type region and the n-type region; it may therefore be composed of a plurality of layers such as, for example a pin diode, a pπvn diode, etc. or, for example two pn junctions in series.

A semiconductor device of the type described above is disclosed in U.S. Pat. No. 5,604,355. In the semiconductor device, which is a "cold cathode", a pn junction is reverse biased in such a way that there is avalanche multiplication of charge carriers. Some electrons may then acquire as much kinetic energy as is necessary for exceeding the electron work function. The emission of these electrons is simplified by providing the semiconductor device with acceleration electrodes or gate electrodes on an insulating layer located on the main surface, which insulating layer leaves an aperture at the location of the emissive region. Emission is still further simplified by providing the semiconductor surface at the location of the emissive region with a material reducing the work function such as, for example cesium.

If such a cathode is built into an electron tube, problems occur in the further manufacturing process. During the process, which is known as spot-knocking, a number of grids in the tube acquire a high to very high mutual voltage difference (30 kV to 100 kV). During this spot-knocking operation, flashovers are produced so that a high-voltage difference (10 kV to 30 kV) occurs between the grid located closest to the cathode and the cathode itself. Such a flashover may also occur during normal use.

The connection wires of the (p-type) substrate, the n-type region as well as the gate electrodes cannot, however, be considered as purely ohmic connections but have a given inductance. This results in a large voltage difference between the substrate and the gate electrode due to capacitive crosstalk between said grid and, for example this substrate. This voltage difference is also dependent on the inductances of the connection wires, the resistance of the (semiconductor) material and the duration of the flashover. As a result, electron tubes comprising this type of cold cathode are often rejected, notably during the spot-knocking process, but also during normal operation.

To prevent destructive breakdown of the insulating layer between the gate electrode and the subjacent substrate, the device disclosed in U.S. Pat. No. 5,604,355 is provided with extra semiconductor structures which convey current during the occurrence of flashovers. However, a possible increase of the voltage of the n-type region, for example via the associated bond-flap, still leads to high currents through the pn junction and through the regions constituted by the n-type surface regions for removing non-emitted electrons (draining channels) while the thin n-type layer is quickly damaged.

SUMMARY OF THE INVENTION

It is, inter alia, an object of the invention to provide an electron tube in which the above-mentioned effect is reduced. It is another object of the invention to provide a semiconductor cathode which is less sensitive to an attack of the n-type region by said flashovers.

To this end, a semiconductor device according to the invention is characterized in that the second part of the pn junction locally has a decreased breakdown voltage.

A divided diode structure is realized by locally decreasing the breakdown voltage. Dimensions and dopings can be chosen to be such that, in the case of an increase of the voltage due to a flashover, this flashover is limited to the breakdown voltage of this (divided) diode structure. Notably when there is a large junction surface with a low resistance, the current will mainly be removed by this diode structure and there will be no destructive current through the pn junction at the area of the thin n-type layer (in the emissive region). Consequently, there is no damage of the emissive part and the draining channel.

A local decrease of the breakdown voltage can be obtained by choosing the donor concentration of the thin n-type layer (the draining channel) to be higher than the donor concentration of the other part of the n-type layer (for example, a contact part) at the location of the pn junction.

The decreased breakdown (and hence the breakdown current) then substantially takes place at the junction between the draining channel and the other part of the n-type region or at the location of the thin n-type channel (hence in the proximity of the emissive region).

A preferred embodiment is therefore characterized in that, outside the thin n-type region, the n-type region adjacent to the main surface comprises parts of different depths. The breakdown then substantially takes place outside the thin n-type region.

The phrase "parts of different depths" is herein understood to mean that the n-type region consists of different parts of different depths and doping, in which a part is provided or not provided in the same manner (implantation, diffusion) but may also, but not necessarily have a specific function such as, for example a contact region.

A preferred embodiment of a semiconductor device according to the invention is characterized in that the second part of the pn junction within the n-type region adjacent to the main surface comprises at least one p-type region enclosed by the n-type region.

A plurality of p-type regions are preferably realized in an n-type region adjacent to the main surface, for example directly under a bond-flap.

To obtain a defined breakdown (as far as location is concerned), the p-type region is chosen to be such that the cross-section of the p-type region enclosed by the n-type region parallel to the main surface has at least an acute angle. To this end, this surface is triangular or star shaped. By introducing a local increase of the radius of curvature of the pn junction and hence an increase of the field strength, the breakdown of the second pn junction will start at the location of such a locally increased radius of curvature.

To obtain a defined breakdown (as far as voltage is concerned), the p-type region enclosed by the n-type region comprises a further p-type region having a higher acceptor concentration than the p-type region enclosed by the n-type region. The defined breakdown may be determined laterally in this case (by the dopings of the n-type region and the p-type regions) or vertically (by the dopings of an n-type contact zone and the p-type regions). When the breakdown is determined laterally, a more or less uniform breakdown is obtained by choosing the cross-section of the p-type region enclosed by the n-type region and parallel to the main surface to be elliptical, preferably circular.

These and other aspects of the invention are apparent from and will be elucidated with reference to the embodiments described hereinafter.

BRIEF DESCRIPTION OF THE DRAWING

In the drawing figures:

FIG. 5 is a diagrammatic plan view and FIGS. 6 and 7 are diagrammatic cross-sections taken on the lines VI—VI and VII—VII, respectively, in FIG. 5 of another semiconductor device according to the invention, while

The Figures are not drawn to scale. Corresponding elements are generally denoted by the same reference numerals.

DESCRIPTION OF THE PREFERRED EMBODIMENTS

Figure 1:
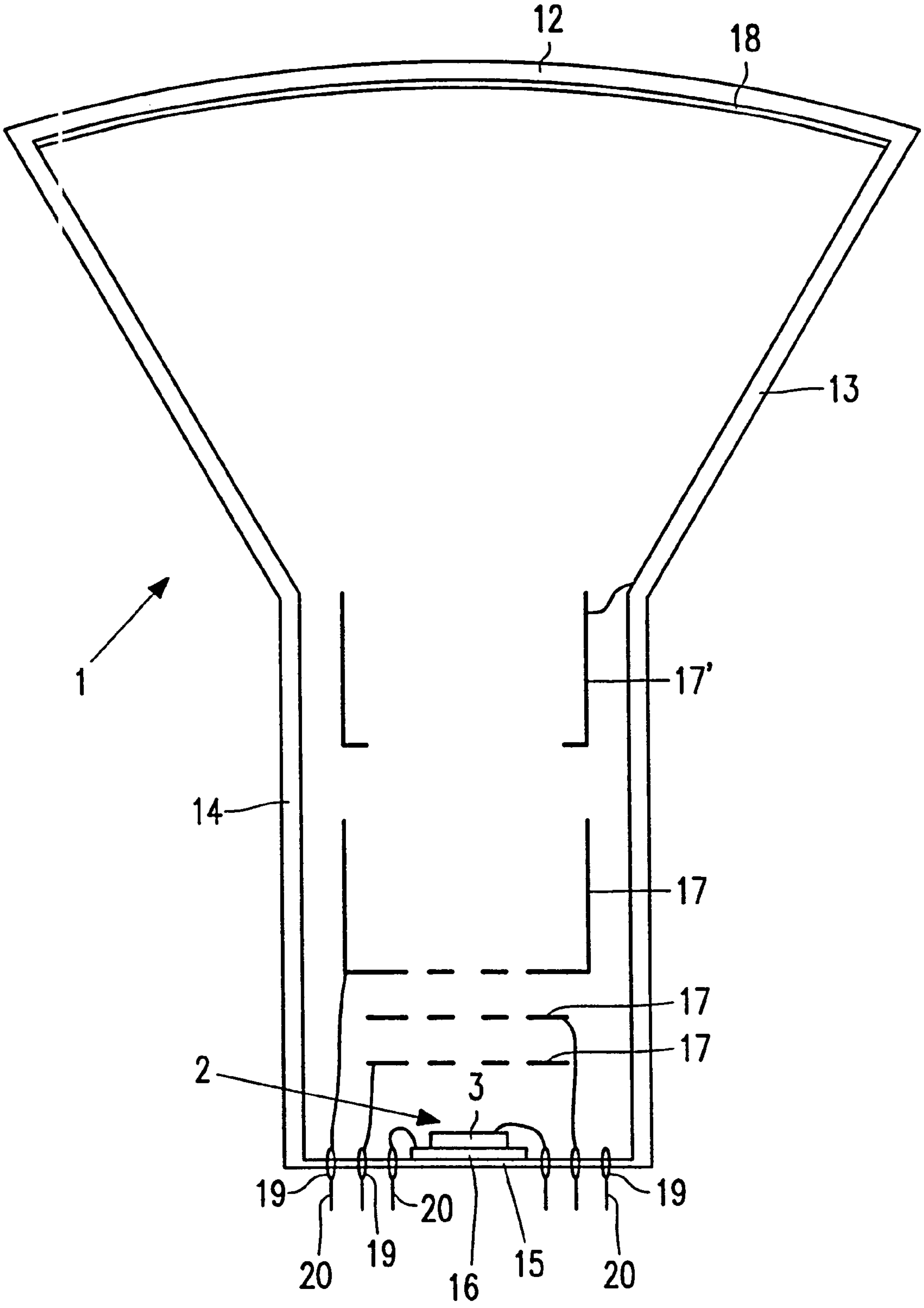
FIG. 1 shows diagrammatically a cathode ray tube.

FIG. 1 shows diagrammatically an electron tube 1, in this case a cathode ray tube for picture display. This tube has a display window 12, a cone 13 and a neck portion 14, with an end wall 15. A support 16 with one or more semiconductor cathodes realized in a semiconductor body 3 is provided on the inner side on the end wall 15. The neck portion 14 accommodates grid electrodes 17. The cathode ray tube further has a screen grid 18 at the location of the display window and, if necessary, deflection electrodes. Further elements associated with such a cathode ray tube, such as phosphors, deflection coils, shadow masks, etc. are omitted in FIG. 1 for the sake of simplicity. For electrical connection of, inter alia, the cathode and the acceleration electrodes, the end wall 15 has lead-throughs 19 via which the connection wires for these elements are electrically interconnected to terminals 20.

In the manufacturing process, such a cathode ray tube is subjected to a process step known as spot-knocking so as to remove burrs and dust particles. In this process step, for example the screen grid 18 and hence grid 17' acquires a high voltage (approximately 40 kV) while the other grid electrodes are provided with pulsed or non-pulsed negative voltages of approximately −30 kV. Then flashovers may occur so that, due to capacitive crosstalk, voltage peaks of approximately 10 V to approximately 2 kV or more are generated on the surface of the semiconductor body (also because the associated connection wire behaves as an inductance with respect to these voltage peaks at the rate at which they are generated). Such flashovers also occur during normal use.

Figure 2:
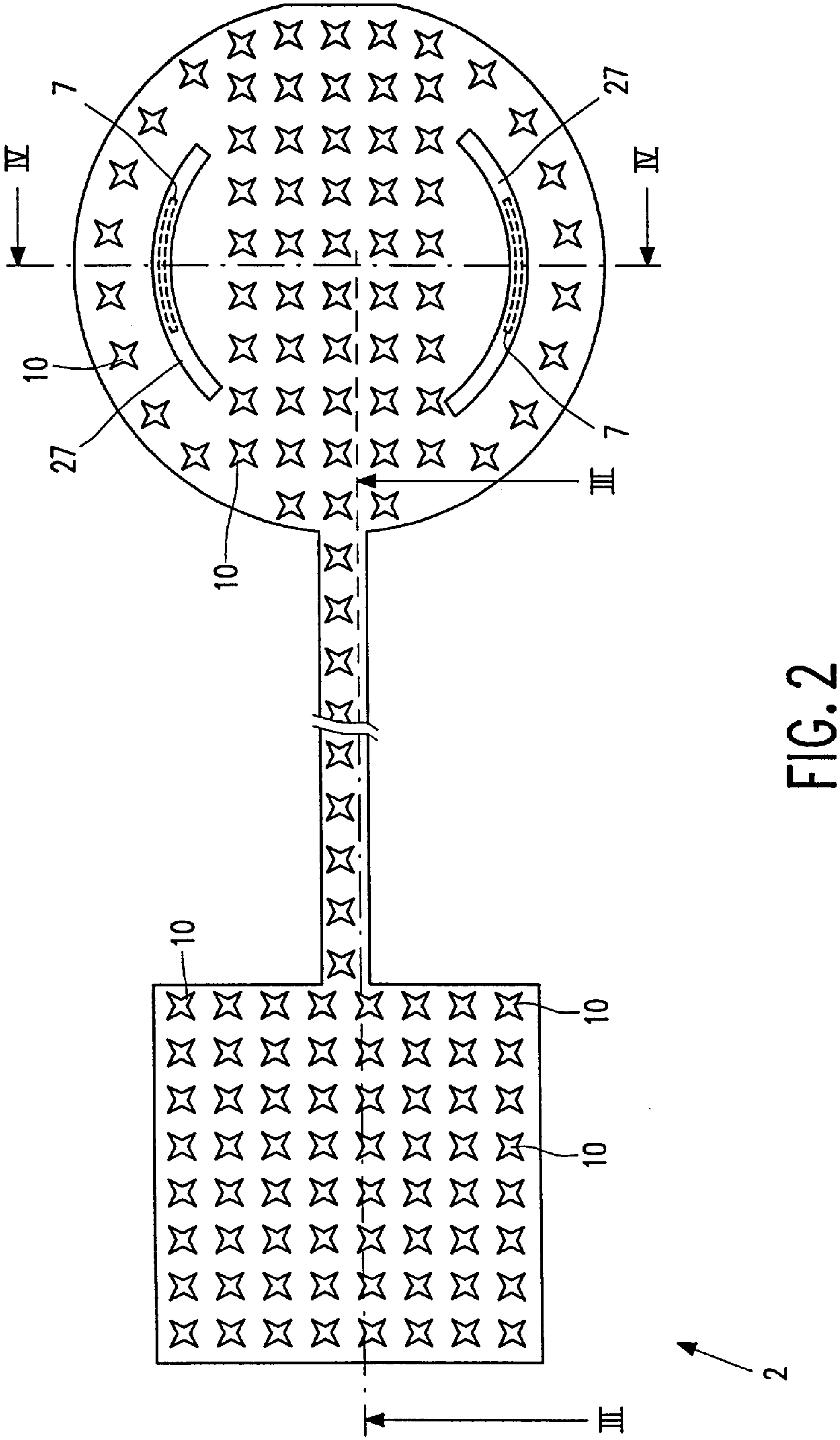
FIG. 2 is a diagrammatic plan view.
Figure 3:
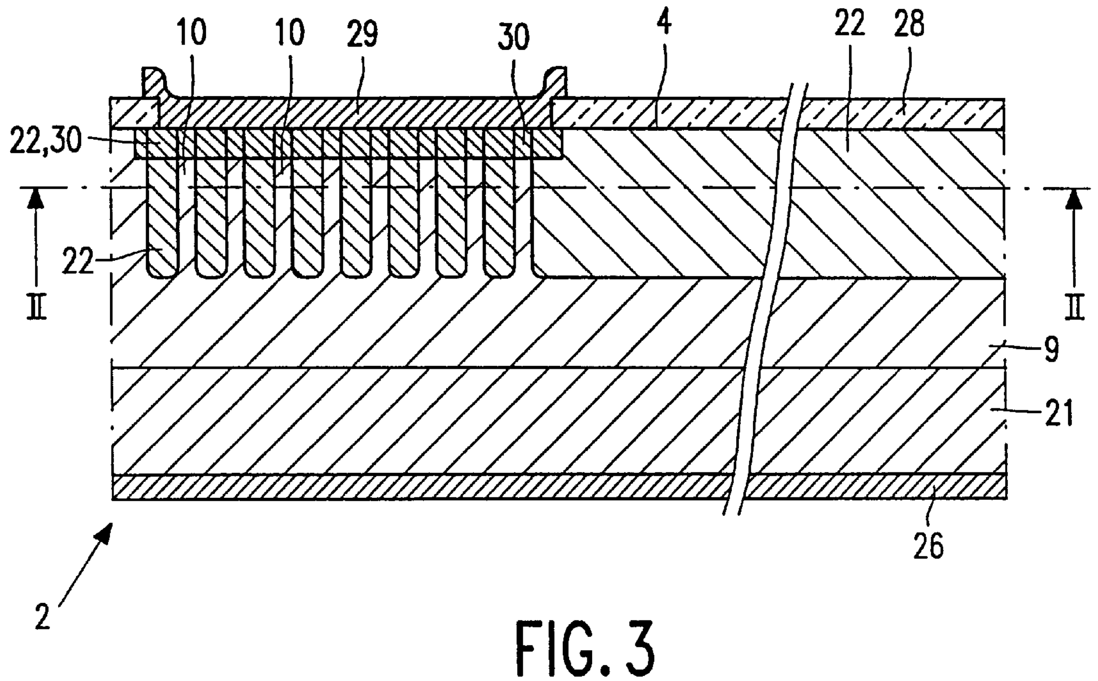
FIGS. 3 and 4 are diagrammatic cross-sections taken on the lines III—III and IV—IV, respectively, in FIG. 2 of a semiconductor device according to the invention.
Figure 4:
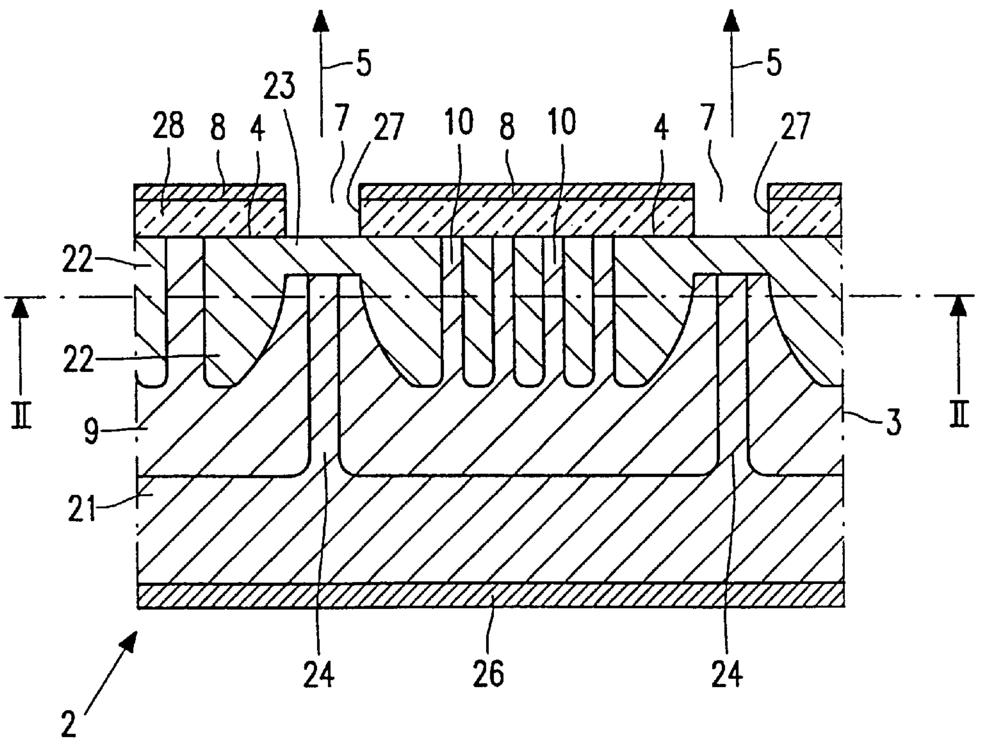

FIG. 2 is a plan view and FIGS. 3 and 4 are cross-sections taken on the lines III—III and IV—IV, respectively, in FIG. 2 of a portion of a possible implementation of the semiconductor cathode 2 in which electrons are generated in the regions 7. To this end, the cathode 2 comprises a semiconductor body 3 (see FIGS. 3, 4) with a p-type substrate 21 of silicon on which a lower doped epitaxial p-type layer 9 is grown. An n-type region 22, 23 consisting of a deep implanted n-type region 22 and a thin n-type layer 23 is present on a main surface 4. To reduce the breakdown in this region at the location of the actual emissive region 7, the acceptor concentration in the substrate is locally raised by means of a p-type region 24 provided by means of ion implantation, which region extends in this example as far as the substrate 21. The n-type layer 23 has such a thickness that the depletion layer does not extend as far as the surface 4 in the case of breakdown of the pn junction between the regions 23 and 24, but is sufficiently thin to pass electrons generated by avalanche or tunnel breakdown. To increase the emission, the electron-emissive surface may be provided, if necessary, with a mono-atomic layer of a material decreasing the work function, such as cesium. In this embodiment, the p-type substrate 21 is contacted via a metallization 26, while the n-type region 22 is connected via a contact metallization 29. The regions to be contacted are connected in the mounted state (see FIG. 1), for example via connection wires to the lead-throughs 19 in the end wall 15.

The electron-emissive region 7 is situated at the location of an aperture 27 in a layer 28 of an insulating material which is silicon oxide in this embodiment. Moreover, an acceleration electrode 8 is situated around the aperture 27 in this embodiment. If the pn junction between the regions 23, 24 is reverse biased, electrons can be generated with a sufficient energy to reach the surface 4. In FIG. 4, the electron current is denoted by means of an arrow with the reference numeral 5.

When a high voltage is generated on the metallization (bond-flap) 29 with respect to the connection 26, the diode constituted by the pn junction between the p-type epitaxial layer 9 (including the p-type region 24) and the n-type regions 22, 23 breaks down so that a high current starts to flow, notably through the junction with the lowest breakdown voltage. Such a high current is destructive for the part of the diode defined by the implanted p-type region 24 and the shallow n-type region 23, which part defines the emissive region, but also for the part of the shallow region 23 which constitutes draining channels for non-emitted electrons.

According to the invention, the part of the pn-junction with a higher breakdown has extra pn junctions in this embodiment, constituted by the n-type region 22 and p-type regions 10 located within the n-type region 22. In this embodiment, the regions 10 form part of the (low-doped) p-type epitaxial layer 9 because these regions are covered with a mask when the n-type region 22 is being provided by means of, for example ion implantation. To prevent a short-circuit of the pn junctions thus formed, constituting a divided (zener) diode, through the bond-flap 29, a shallow n-type contact zone 30 is provided, also by means of, for example ion implantation, at the location of this bond-flap.

The extra pn junctions thus formed have a slightly higher breakdown voltage than those in the emissive region, but a slightly lower breakdown voltage than the pn junction between the n-type region 22 and the epitaxial layer 9. When a flashover occurs, which hits the bond-flap 29, avalanche breakdown will occur in the pn junctions at a positive voltage of the n-type region 22 and the contact zone 30 with respect to the p-type region 10, which voltage is higher than the breakdown voltage of the pn junction between the regions 23 and 24. Consequently, current is removed, and notably when the current-conveying surface is large with respect to the surface of the part of the pn junction having the decreased breakdown, the majority of the current will be removed by this divided diode. A further increase of the voltage across the pn junction and damage of the emissive part are thus prevented.

By giving the cross-section of the p-type region 10 parallel to the main surface 4 an acute angle (for example, making it star-shaped or triangular), the magnitude of the field strength at the location of this angle is also determined by this angle and hence the magnitude of the breakdown voltage is determined. In this way, a (location-)defined breakdown is achieved. The voltage at which the divided (zener) diode breaks down is determined by the dopings of the n-type regions 22, 30 and the p-type regions 10, in combination with the chosen dopings and the eventual radius of curvature of the local pn junction.

Figure 5:
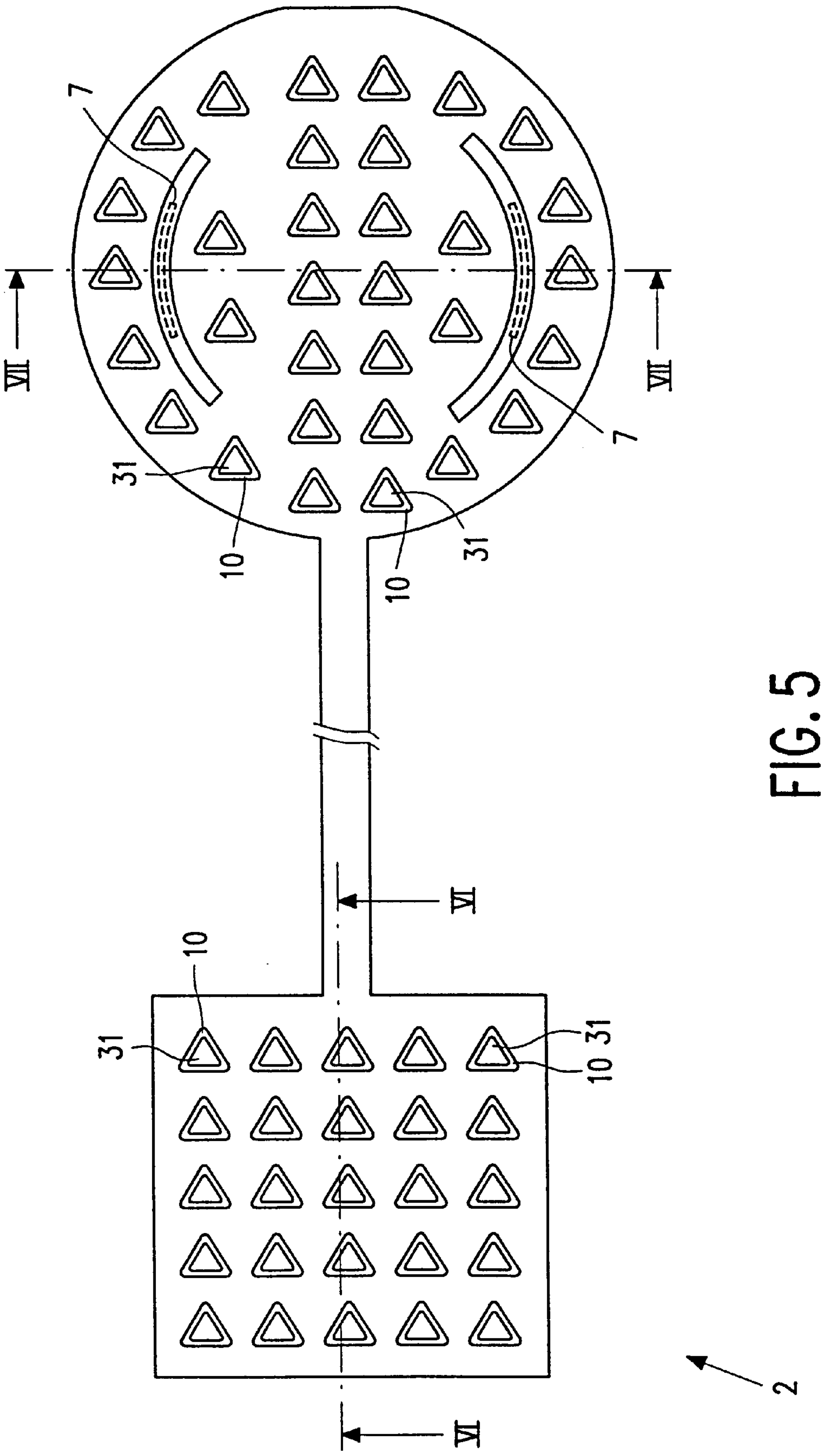
Figure 6:
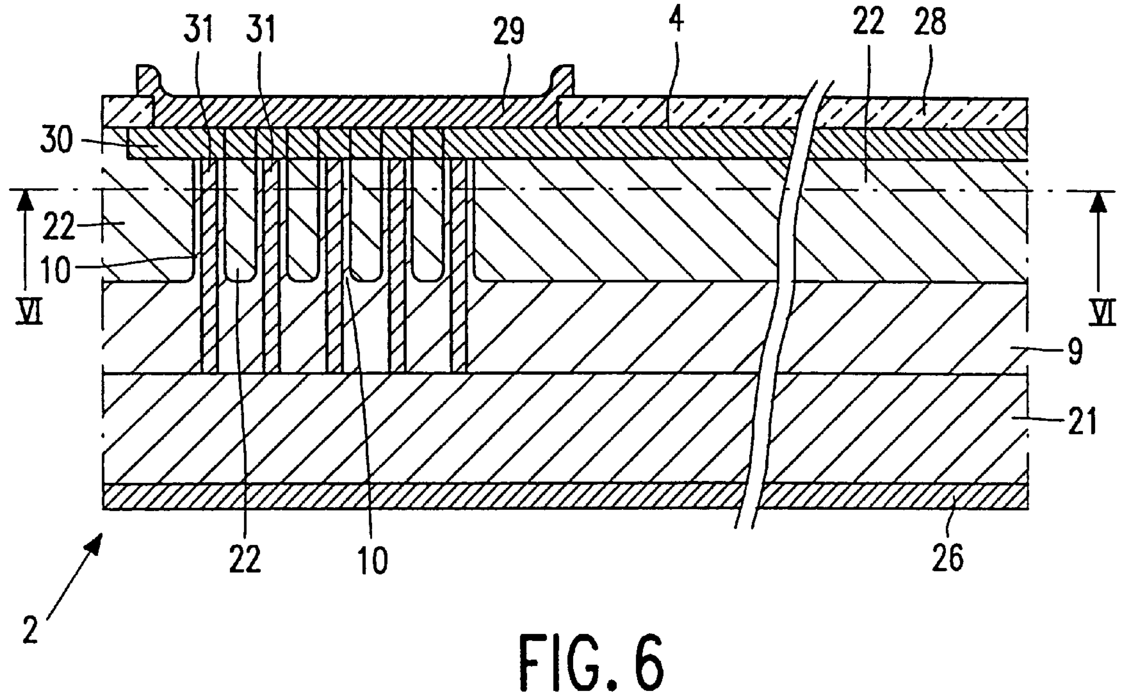
Figure 7:
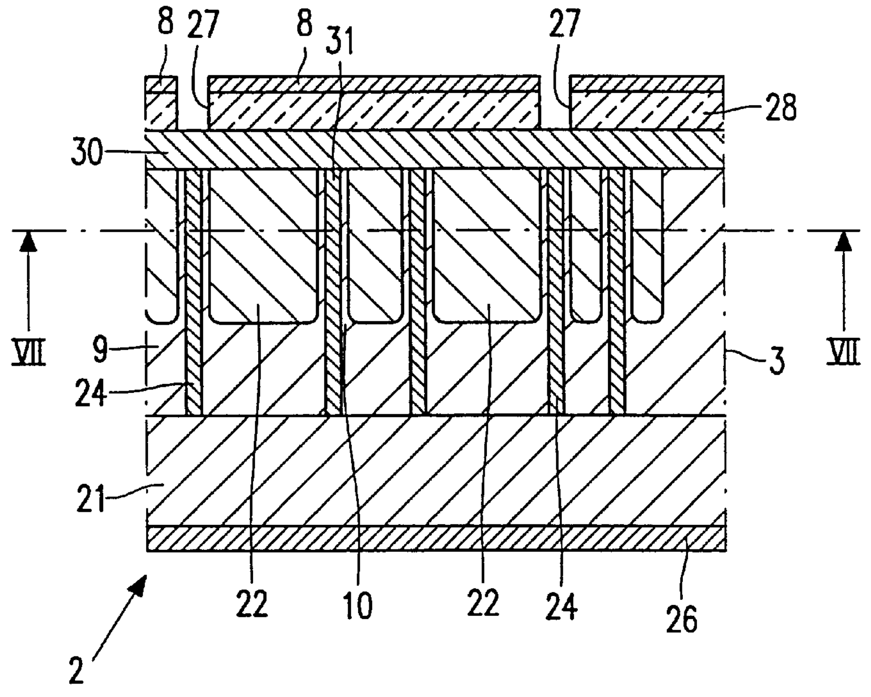

FIGS. 5, 6 and 7 show variants of the device shown in FIGS. 2, 3 and 4, in which the divided (zener) diode is realized as a $p^+$-$p^-$-n junction. To this end, extra $p^+$ regions 31 are present within the $p^-$ regions 10. In this case, the shallow contact zone 30 is provided at the area of the entire n-type region 22. The other reference numerals denote the same elements as in the previous embodiment.

Figure 8:
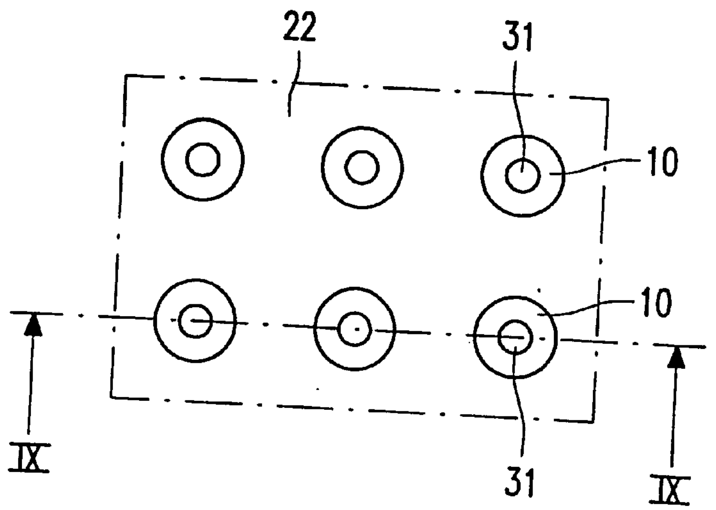
FIGS. 8, 9 and 10 show variants of the device shown in FIGS. 2, 3.
Figure 9:
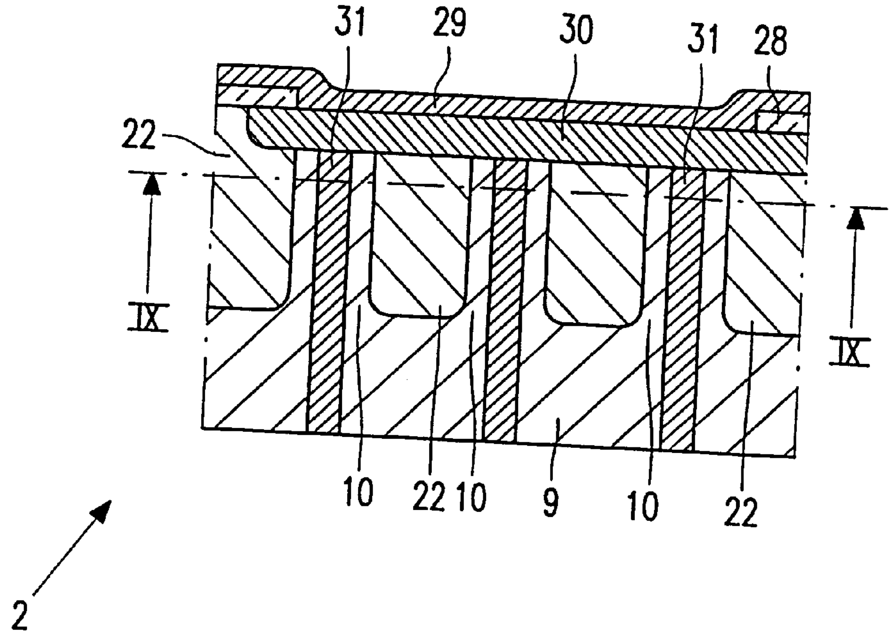
Figure 10:
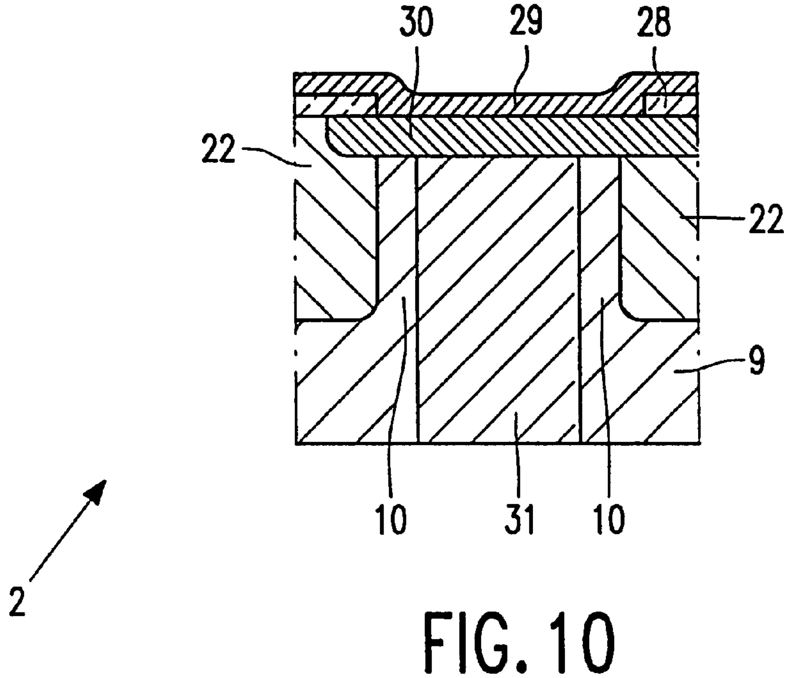

As is shown in the embodiments of FIGS. 2 to 4, the voltage at which the divided (zener) diode breaks down is determined by the dopings of the n-type region 22 and the p-type regions 10. In this case, a lateral breakdown is concerned. In the embodiments of FIGS. 5 to 7, breakdown may also occur (dependent on the chosen dopings) between the contact zone 30 and the highly doped p-type region 31. This is shown in the embodiments of FIGS. 8, 9. To avoid influences of local electric field strength, regions 10, 31 with a circular circumference have been chosen. Apart from the breakdown in the emissive region, avalanche breakdown now first takes place between the $p^+$-type regions 31 and the contact zone 30. By making the cross-sections elliptic, the local electric field strength plays a role again with regard to the location where the breakdown starts. FIG. 10 shows a variant in which the current-conveying region is enlarged by forming the p-type regions 10 (as well as the $p^+$-type regions 31) as one whole.

Figure 11:
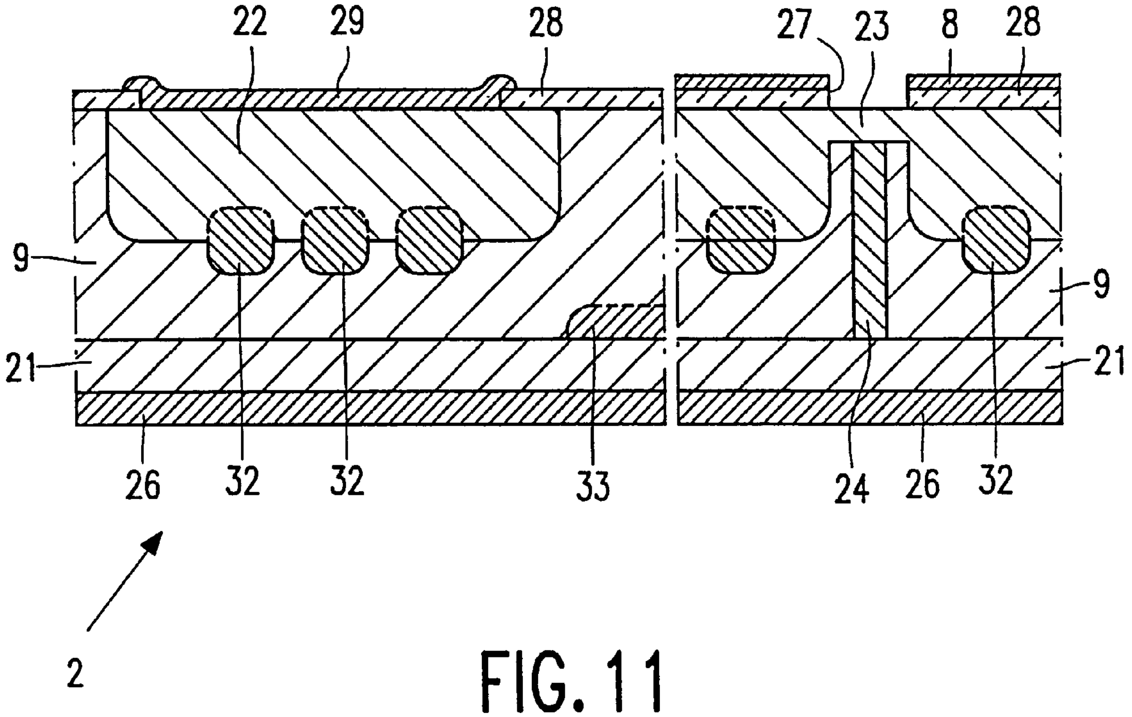
FIG. 11 is a diagrammatic cross-section of another semiconductor device according to the invention.

FIG. 11 shows a variant in which the pn junction has acquired a decreased breakdown because extra $n^+$ regions 32 have been implanted in the epitaxial layer 9 (and partly in the n-type layer 22 in this embodiment). Here again, the lower local breakdown voltage is also dependent on the dopings used and on the eventual radius of curvature of the local pn junction. The $n^+$ regions, which are surrounded by the epitaxial layer 9 in this embodiment, may again be given, for example, a triangular or star-shaped cross-section for this purpose. A combination of measures of FIG. 11 and those of FIGS. 2 to 4 and 5 to 7 is alternatively possible. Another way of achieving a lower local breakdown voltage is the provision of a $p^+$ region 33 (denoted by broken lines in FIG. 11) in the epitaxial layer 9.

Several variations of the geometries shown are possible. The emissive region may also have various shapes. In addition, a plurality of cathodes may be realized in one body.

In summary, the invention relates to a semiconductor cathode (for an electron tube) having an emissive part separated from a contact part which has locations at which controlled breakdown occurs on a contact metallization at too high voltages, so that, during manufacture and operation, the emissive part is protected from damage.

What is claimed is:

1. A semiconductor device for emitting electrons, comprising a semiconductor body with at least one pn junction between an n-type region adjacent to a main surface and a p-type region, in which electrons emitted from the semiconductor body are generated by applying a voltage in the reverse direction across the pn junction, a first part of the pn junction, at the location of an emissive part of the pn junction, extending substantially parallel to the main surface and locally having a lower breakdown voltage than a second part of the pn junction, the first part being separated from the main surface by a thin n-type region having such a thickness and doping that the depletion zone does not extend as far as the main surface at the breakdown voltage, but remains separated from said main surface by a surface layer which is sufficiently thin to pass generated electrons, characterized in that the second part of the pn junction locally has a decreased breakdown voltage.

2. A semiconductor device as claimed in claim 1, characterized in that the second part of the pn junction comprises a portion defined by at least one p-type region enclosed by the n-type region.

3. A semiconductor device as claimed in claim 2, characterized in that the cross-section of the p-type region enclosed by the n-type region parallel to the main surface has at least an acute angle.

4. A semiconductor device as claimed in claim 2, characterized in that the cross-section of the p-type region enclosed by the n-type region parallel to the main surface is substantially elliptic.

5. A semiconductor device as claimed in claim 2, characterized in that the p-type region enclosed by the n-type region comprises a further p-type region having a higher acceptor concentration than the p-type region enclosed by the n-type region.

6. A semiconductor device as claimed in claim 2, characterized in that the p-type region and the p-type region enclosed by the n-type region form part of an epitaxial layer.

7. A semiconductor device as claimed in claim 1, characterized in that, outside the thin n-type region, the n-type region adjacent to the main surface comprises parts of different depths.

8. A semiconductor device as claimed in claim 7, characterized in that the second part of the pn junction within the p-type region comprises at least one part of the n-type region adjacent to the main surface and enclosed by the p-type region.

9. An electron tube including a semiconductor device for emitting electrons, said device comprising a semiconductor body with at least one pn junction between an n-type region adjacent to a main surface and a p-type region, in which electrons emitted from the semiconductor body are generated by applying a voltage in the reverse direction across the pn junction, a first part of the pn junction, at the location of an emissive part of the pn junction, extending substantially parallel to the main surface and locally having a lower breakdown voltage than a second part of the pn junction, the first part being separated from the main surface by a thin n-type region having such a thickness and doping that the depletion zone does not extend as far as the main surface at the breakdown voltage, but remains separated from said main surface by a surface layer which is sufficiently thin to pass generated electrons, characterized in that the second part of the pn junction locally has a decreased breakdown voltage.

* * * * *